United States Patent
Al Ahmad et al.

(10) Patent No.: US 9,748,872 B2
(45) Date of Patent: Aug. 29, 2017

(54) VIBRATIONAL ENERGY HARVESTING SYSTEM

(71) Applicant: UNITED ARAB EMIRATES UNIVERSITY, Al-Ain (AE)

(72) Inventors: Mahmoud Al Ahmad, Al Ain (AE); Baker Mohammad, Abu Dhabi (AE)

(73) Assignees: United Arab Emirates University, Al Ain (AE); Khalifa University of Science and Technology, Abu Dhabi (AE)

(*) Notice: Subject to any disclaimer, the term of this patent is extended or adjusted under 35 U.S.C. 154(b) by 501 days.

(21) Appl. No.: 14/537,277

(22) Filed: Nov. 10, 2014

(65) Prior Publication Data

US 2016/0134204 A1    May 12, 2016

(51) Int. Cl.
*H01L 41/113* (2006.01)
*H02N 2/18* (2006.01)

(52) U.S. Cl.
CPC ......... *H02N 2/181* (2013.01); *H01L 41/1136* (2013.01)

(58) Field of Classification Search
CPC .............. H01L 41/113; H01L 41/1132; H01L 41/1134; H01L 41/1136; H01L 41/1138; H02N 2/18; H02N 2/181
USPC ....................................... 310/314, 317, 339
See application file for complete search history.

(56) References Cited

U.S. PATENT DOCUMENTS

| | | | | |
|---|---|---|---|---|
| 2003/0137221 A1* | 7/2003 | Radziemski | ........ | H01L 41/1875 310/339 |
| 2005/0206275 A1* | 9/2005 | Radziemski | ........ | H01L 41/1136 310/339 |
| 2008/0084138 A1* | 4/2008 | Micallef | .............. | H02N 11/008 310/339 |
| 2014/0361662 A1* | 12/2014 | Al Ahmad | ............. | H02N 2/181 310/318 |

OTHER PUBLICATIONS

Al Ahmad, Mahmoud et al., "Modeling the Power Output of Piezoelectric Energy Harvesters," Journal of Electronic Materials, vol. 40, No. 7, 2011, TMS, pp. 1477-1484.
(Continued)

*Primary Examiner* — Derek Rosenau
(74) *Attorney, Agent, or Firm* — Withrow & Terranova, P.L.L.C.

(57) ABSTRACT

A vibrational energy harvesting system is disclosed. Included is a first energy harvesting unit and a second energy harvesting unit that convert mechanical vibrations into first and second AC signals, respectively. A first AC-DC converter coupled to the first energy harvesting unit and a second AC-DC converter coupled to the second energy harvesting unit are configured to convert the first AC signal and the second AC signal into a first DC signal and a second DC signal, respectively. A DC-DC converter is coupled between the second AC-DC converter and a controller, and is configured to receive the second DC signal and provide a regulated DC signal by using energy from the second DC signal in response to a periodic signal generated by the controller. Typically, an energy storage unit is coupled to the DC-DC converter and is configured to receive and store energy from the regulated DC signal.

20 Claims, 2 Drawing Sheets

(56) References Cited

OTHER PUBLICATIONS

Elvin, N. et al., "A self-powered damage detection sensor," Journal of Strain Analysis for Engineering Design, vol. 38, No. 2, 2003, IMechE, pp. 115-124.

Elvin, Niell G. et al., "A self-powered mechanical strain energy sensor," Smart Materials and Structures, vol. 10, 2001, Institute of Physics Publishing, pp. 293-299.

Granstrom, Jonathan et al., "Energy harvesting from a backpack instrumented with piezoelectric shoulder straps," Smart Materials and Structures, vol. 16, No. 5, IOP Publishing, pp. 1810-1820.

Häusler, E. et al., "Implantable Physiological Power Supply With PVDF Film," Ferroelectrics, vol. 60, 1984, Gordon and Breach, Science Publishers, Inc., pp. 277-282.

Kymisses, John et al., "Parasitic Power Harvesting in Shoes," Second IEEE International Conference on Wearable Computers, Oct. 19-20, 1998, Pittsburgh, PA, IEEE, 8 pages.

Niu, Penglin et al., "Evaluation of Motions and Actuation Methods for Biomechanical Energy Harvesting," 2004 35th Annual IEEE Power Electronics Specialists Conference, Jun. 20-25, 2004, Aachen, Germany, IEEE, 2100-2106.

Piazza, Gianluca et al., "One and Two Port Piezoelectric Higher Order Contour-Mode MEMS Resonators for Mechanical Signal Processing," Solid-State Electronics, vol. 51, Issues 11-12, Dec. 2007, pp. 1596-1608.

Priya, Shashank et al., "Modeling of electric energy harvesting when using piezoelectric windmill," Applied Physics Letters, vol. 87, 2005, American Institute of Physics, 4 pages.

Roundy, Shad et al., "A study of low level vibrations as a power source for wireless sensor nodes," Computer Communications, vol. 26, 2003, Elsevier Science B.V., pp. 1131-1144.

Roundy, Shad et al., "Energy Scavenging for Wireless Sensor Networks: with Special Focus on Vibrations," Springer US, 2004, 218 pages.

Roundy, Shad, "On the Effectiveness of Vibration-based Energy Harvesting," Journal of Intelligent Material Systems and Structures, vol. 16, Oct. 2005, Sage Publications, pp. 809-823.

Sodano, Henry A. et al., "A Review of Power Harvesting from Vibration using Piezoelectric Materials," Shock and Vibration Digest, vol. 36, No. 3, May 2004, Sage Publications, pp. 197-205.

Sodano, Henry A. et al., "An experimental comparison between several active composite actuators for power generation," Smart Materials and Structures, vol. 15, 2006, IOP Publishing Ltd, pp. 1211-1216.

Sodano, Henry A. et al., "Comparison of Piezoelectric Energy Harvesting Devices for Recharging Batteries," Journal of Intelligent Material Systems and Structures, vol. 16, No. 10, 2005, pp. 799-807.

Sodano, Henry A. et al., "Generation and Storage of Electricity from Power Harvesting Devices," Journal of Intelligent Material Systems and Structures, vol. 16, No. 1, 2005, pp. 67-75.

Sterken, T. et al., "Comparative Modelling for Vibration Scavengers," Proc. of IEEE's Sensors Conference, Oct. 24-27, 2004, Vienna, Austria, IEEE, 1249-1252.

Taylor, G. W. et al., "The Energy Harvesting Eel: A Small Subsurface Ocean/River Power Generator," IEEE Journal of Oceanic Engineering, vol. 26, No. 4, IEEE, Oct. 2001, pp. 539-547.

Vullers, R.J.M. et al., "Micropower energy harvesting," Solid-State Electronics, vol. 53, 2009, Elsevier Ltd., pp. 684-693.

Williams, C.B. et al., "Analysis of a Micro-Electric Generator for Microsystems," Transducers '95, The 8th International Conference on Solid-State Sensors and Actuators, and Eurosensors IX, Jun. 25-29, 1995, Stockholm, Sweden, pp. 396-372.

\* cited by examiner

VIBRATIONAL ENERGY HARVESTING SYSTEM

FIELD OF THE DISCLOSURE

The present disclosure relates to energy harvesting systems for electronic devices.

BACKGROUND

Energy harvesting is a technique that captures energy from an environment in which an energy harvester is placed. Power sources for energy harvesters include electromagnetic sources (e.g., RF signal), kinetic sources (e.g., motion of walking), thermal sources (e.g., temperature gradients), and biochemical sources (e.g., glucose). Kinetic sources are particular attractive because they are readily available. In particular, vibrational sources are relatively common. As such, vibrational energy harvesters such as piezoelectric cantilevers and resonators are especially desirable.

Due to the ability of piezoelectric cantilevers and resonators to withstand large amounts of strain, using them to harvest vibrational energy provides sufficient output for small-scale power applications. The strain can come from many different sources such as human motion, low-frequency seismic vibrations, and acoustic noise and radio frequency (RF) propagations. However, the majority of vibration sources with strong amplitude lie in a range between 4 Hz and 300 Hz with an acceleration of around 1G. Output power depends strongly on the frequency of vibration. Typically, more power is generated at resonant frequencies.

Power harvesting from these electric materials has been investigated for several different potential applications. One such application identified in the prior art pertains to harvesting energy using piezoelectric materials embedded in shoes. Another energy harvesting application involves a piezoelectric polymer backpack strap which generates electrical energy from an oscillating tension in the strap during walking. Even the motion of breathing in and out has been studied for energy harvesting using piezoelectric polymers. Yet another idea has been to use a relatively small windmill to induce vibration in a series of piezoceramic beams. Piezoelectric polymers have also been investigated for generating electrical power from water currents. Another study investigated the storage of electrical energy from energy harvesting devices in batteries and capacitors. Others have characterized various piezoelectric materials, while still others have built wireless self-powered strain sensors that use harvested energy as both power sources and sensing signals. Further still, at least one study has formulated a model of a power harvesting system that comprises a cantilever beam with attached piezoelectric patches. Moreover, others have performed a comparison of piezoelectric, electromagnetic, and electrostatic configurations as a means of harvesting energy from a variety of vibration sources. These studies have generally concluded that the selection of a particular energy harvesting configuration is application dependent, but that piezoelectric materials based harvesters are the simplest to implement overall. What is needed is a vibrational energy harvesting system that can harvest energy from the environment where it is placed.

SUMMARY

A vibrational energy harvesting system is disclosed. Included is a first energy harvesting unit and a second energy harvesting unit that convert mechanical vibrations into first and second AC signals, respectively. A first AC-DC converter coupled to the first energy harvesting unit and a second AC-DC converter coupled to the second energy harvesting unit are configured to convert the first AC signal and the second AC signal into a first DC signal and a second DC signal, respectively. A DC-DC converter is coupled between the second AC-DC converter and a controller, and is configured to receive the second DC signal and provide a regulated DC signal by using energy from the second DC signal in response to a periodic signal generated by the controller. Typically, an energy storage unit is coupled to the DC-DC converter and is configured to receive and store energy from the regulated DC signal. Moreover, the disclosed vibrational energy harvesting system can be completely self-powered.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
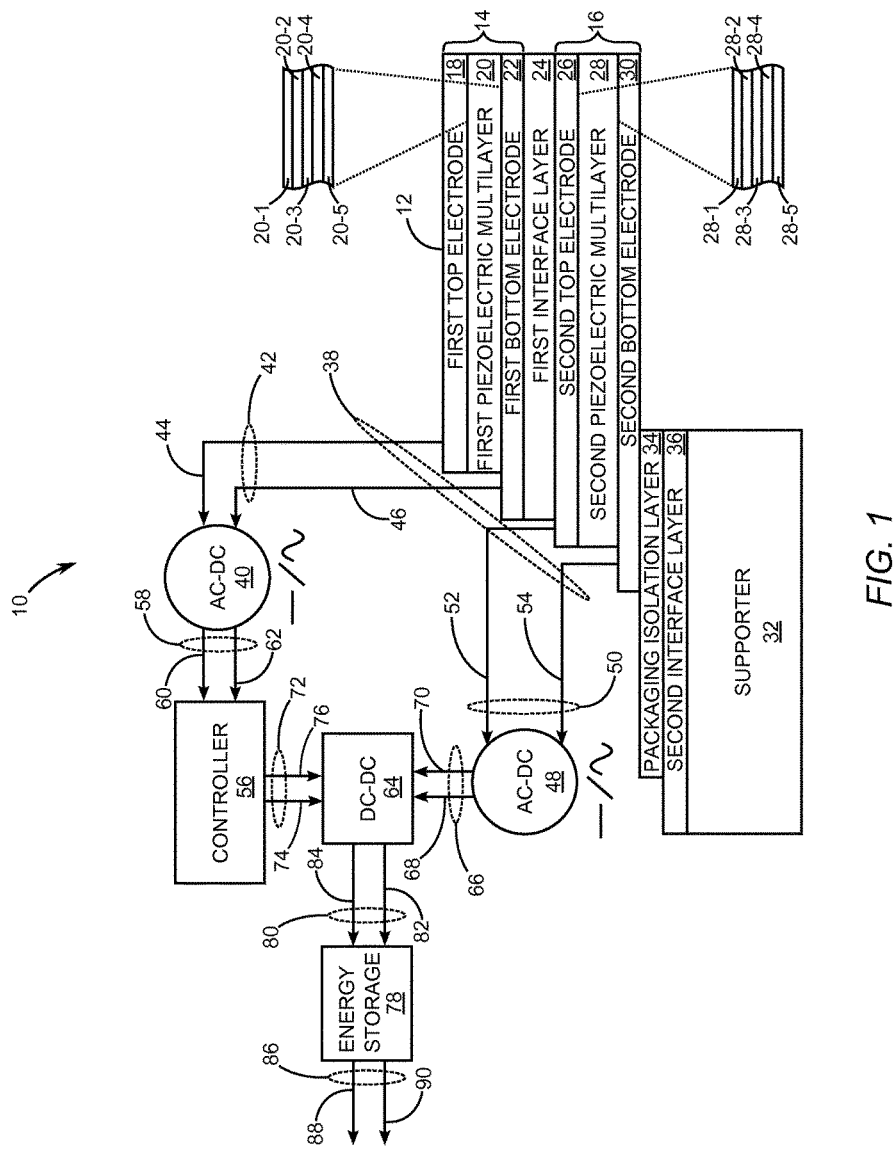
FIG. 1 is a schematic diagram of a vibrational energy harvesting system that is in accordance with the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "disposed on," "in," or extending "onto" another element, it can be directly over, directly on, directly disposed on, directly in, or extend directly onto the other element or intervening elements may also be present. In contrast, when an element is referred to as being "directly over," "directly on," "directly disposed on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The present disclosure provides a vibrational energy harvesting system that will facilitate versatility and viability of high data rate wireless sensing and monitoring systems for remote and difficult to reach locations. The operational performance of the vibrational energy harvesting system of the present disclosure will enable new classes of applications for medical and environmental sensing. For example, the vibrational energy harvesting system of the present disclosure harvests energy from the environment in which it is placed, which makes it suitable for powering environmental sensors embedded in structures such as buildings, vehicles, and medical implants. Moreover, the vibrational energy harvesting system of the present disclosure can be completely self-powered.

A vibrational energy harvesting system 10 has a multilayer piezoelectric cantilever 12 that includes a first energy harvesting unit 14 and a second energy harvesting unit 16. The first energy harvesting unit 14 includes a first top electrode 18 for collecting charges, a first piezoelectric multilayer 20 comprising a plurality of piezoelectric materials 20-1, 20-3 and 20-5 with an embedded plurality of electrodes 20-2 and 20-4, and a first bottom electrode 22 for collecting charges. The plurality of piezoelectric materials 20-1, 20-3 and 20-5 are typically arranged in relatively thin layers that are sub-millimeters thick. As a result, the first piezoelectric multilayer 20 generates a lower voltage and higher current relative to a single piezoelectric layer of similar total thickness. The embedded plurality of electrodes 20-2 and 20-4 collect currents from the plurality of piezoelectric materials 20-1, 20-3 and 20-5 that add together to provide an output current that is collected by the first top electrode 18 and the first bottom electrode 22.

A first interface layer 24 provides electrical isolation between the first energy harvesting unit 14 and the second energy harvesting unit 16 that has a second top electrode 26 for collecting charges. The second energy harvesting unit 16 also includes a second piezoelectric multilayer 28 comprising plurality of piezoelectric materials 28-1, 28-3 and 28-5 with an embedded plurality of electrodes 28-2 and 28-4, and a second bottom electrode 30 for collecting charges. The plurality of piezoelectric materials 28-1, 28-3 and 28-5 are typically arranged in relatively thin layers that are sub-millimeters thick. As a result, the second piezoelectric multilayer 28 generates a lower voltage and higher current relative to a single piezoelectric layer of similar total thickness. The embedded plurality of electrodes 28-2 and 28-4 collect currents from the plurality of piezoelectric materials 28-1, 28-3 and 28-5 that add together to provide an output current that is collected by the second top electrode 26 and the second bottom electrode 30.

A supporter 32 is coupled to the multilayer piezoelectric cantilever 12 through a packaging isolation layer 34 that provides electrical isolation between the supporter 32 and the multilayer piezoelectric cantilever 12. A second interface layer 36 situated between the supporter 32 and the multilayer piezoelectric cantilever 12 holds the multilayer piezoelectric cantilever 12 and the packaging isolation layer 34 to the supporter 32. In an exemplary embodiment, the second interface layer 36 provides additional electrical isolation between the supporter 32 and the multilayer piezoelectric cantilever 12.

The vibrational energy harvesting system 10 is configured to provide decoupling of a harvested energy output 38 from the first energy harvesting unit 14, and the second energy harvesting unit 16. However, coupling of the harvested energy output 38 to the first energy harvesting unit 14 and the second energy harvesting unit 16 is necessary for a sustainable energy harvesting operation. A highly desirable feature is provided in that the vibrational energy harvesting system 10 can be completely self-powered.

A first AC-DC converter 40 is electrically connected to the first energy harvesting unit 14 through a first electrical bus 42, which in this exemplary embodiment is made up of a first connector 44 and a second connector 46. A second AC-DC converter 48 is electrically connected to the second energy harvesting unit 16 through a second electrical bus 50, which in this exemplary embodiment is made up of connectors 52 and 54. Harvested power propagates from the first energy harvesting unit 14 and the second energy harvesting unit 16 by way of output signals. Each output signal includes an alternating current component and an alternating voltage component.

Characteristics of the output signals such as amplitude and frequency depend upon various parameters that include but are not limited to, elasticity and piezoelectric coefficients of the materials making up the multilayer piezoelectric cantilever 12, as well as dielectric constants of the materials making up the multilayer piezoelectric cantilever 12. Further still, various structural geometries for the vibrational energy harvesting system 10 and/or linear acceleration impact the characteristics of the output signals. Each of the output signals are converted from alternating current to direct current by way of the first AC-DC converter 40 and the second AC-DC converter 48, respectively. It is to be understood that the first AC-DC converter 40 and the second AC-DC converter 48 can each include local energy storage to facilitate a constant energy feed into the DC-DC converter 64. The local energy storage can be capacitors or inductors or combinations thereof.

A DC voltage output from the first AC-DC converter 40 provides DC bias for a controller 56 through a third electrical bus 58, which in this exemplary embodiment is made up of connectors 60 and 62. A DC voltage output from the second AC-DC converter 48 provides DC bias for a DC-DC converter 64 through a fourth electrical bus 66, which in this exemplary embodiment is made up of connectors 68 and 70. A periodic signal output from the controller 56 is transmitted to the DC-DC converter 64 over a fifth electrical bus 72 made up of connectors 74 and 76. The periodic signal output from the controller 56 switches a transistor (not shown), integrated within the DC-DC converter 64, ON and OFF to regulate energy output from the DC-DC converter 64.

Regulation of the energy output from the DC-DC converter 64 can be a boost or a buck of an input voltage applied to the fourth electrical bus 66 by the second AC-DC converter 48. The DC-DC converter 64 is configured to boost voltage of the second DC signal and thereby generate the regulated DC signal as an average voltage of the second DC signal falls below a first predetermined voltage level and buck voltage of the second DC signal and thereby generate the regulated DC signal as an average voltage of the second DC signal rises above a second predetermined voltage level.

In at least one embodiment, the first predetermined voltage level and the second predetermined level are the same. The energy output from the DC-DC converter 64 is transferred to an energy storage unit 78 by way of a sixth electrical bus 80 made up of connectors 82 and 84. The energy storage unit 78 can be, but is not limited to, electrochemical batteries and/or capacitors. Energy stored in the energy storage unit 78 is released on demand to a load (not shown) over a seventh electrical bus 86 made up of connectors 88 and 90.

Figure 2A:
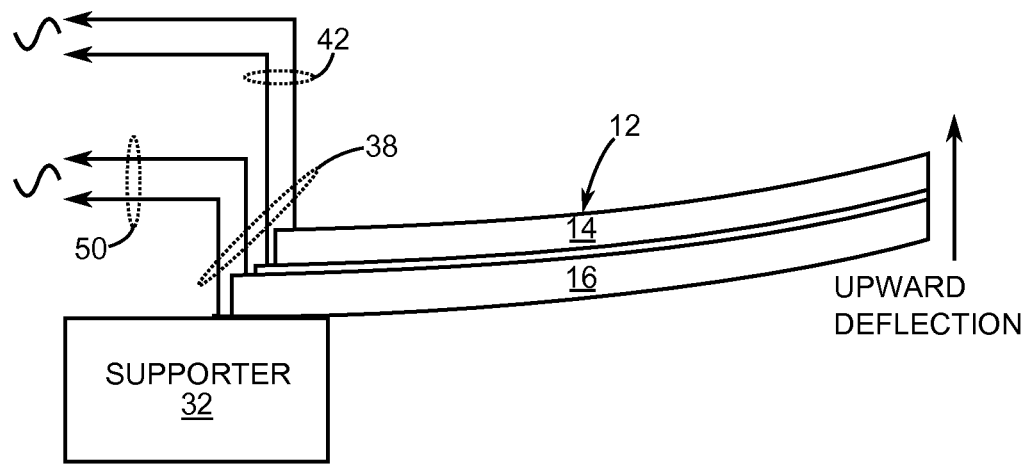
FIG. 2A depicts the multilayer piezoelectric cantilever undergoing an upward deflection due to a vibration applied through the supporter.
Figure 2B:
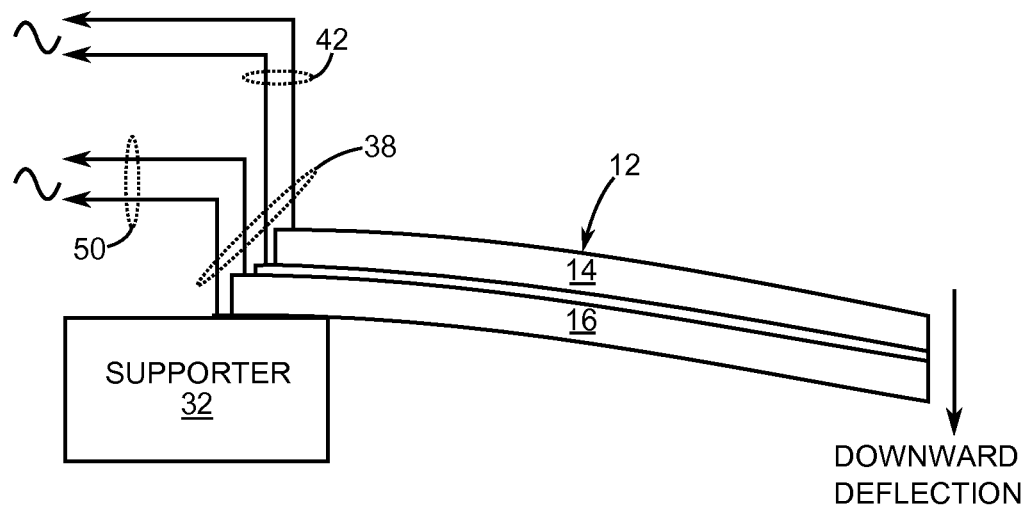
FIG. 2B depicts the multilayer piezoelectric cantilever undergoing a downward deflection due to a vibration applied through the supporter.

FIGS. 2A and 2B are diagrams depicting operating principles of the multilayer piezoelectric cantilever 12. In operation, a vibration puts the multilayer piezoelectric cantilever 12 beam into motion. In particular, FIG. 2A depicts the multilayer piezoelectric cantilever 12 undergoing an upward deflection due to a vibration applied through the supporter 32, which is typically fastened to a vibration source (not shown). During the upward deflection of the multilayer piezoelectric cantilever 12, the first energy harvesting unit 14 and the second energy harvesting unit 16 generate AC signals that are transmitted through the harvested energy output 38. The AC signal generated by the first energy harvesting unit 14 is carried on the first electrical bus 42, whereas the AC signal generated by the second energy harvesting unit 16 is carried by the second electrical bus 50. The upward deflection of the multilayer piezoelectric cantilever 12 compresses piezoelectric materials 20-1 (FIG. 1) along the first top electrode 18 (FIG. 1), while simultaneously placing piezoelectric materials 20-5 (FIG. 1) along the first bottom electrode 22 (FIG. 1) under tension. As a result of the upward deflection, a net negative charge collects on the first top electrode 18 and a net positive charge is collects on the first bottom electrode 22. Similarly, the upward deflection of the multilayer piezoelectric cantilever 12 compresses piezoelectric materials 28-1 (FIG. 1) along the second top electrode 26 (FIG. 1), while simultaneously placing piezoelectric materials 28-5 (FIG. 1) along the second bottom electrode 30 (FIG. 1) under tension. As a result of the upward deflection, a net negative charge collects on the second top electrode 26 and a net positive charge collects on the second bottom electrode 30.

As the multilayer piezoelectric cantilever 12 moves towards the downward deflection depicted in FIG. 2B, the multilayer piezoelectric cantilever 12 compresses piezoelectric materials 28-5 (FIG. 1) along the second bottom electrode 30 (FIG. 1), while simultaneously placing the piezoelectric materials 28-1 (FIG. 1) along the second top electrode 26 (FIG. 1) under tension. As a result of the downward deflection, a net positive charge collects on the second top electrode 26 and a net negative charge is collects on the second bottom electrode 30.

Returning to FIG. 1, the AC signal conveyed on the first electrical bus 42 is converted to a DC signal by the first AC-DC converter 40, and the AC signal conveyed on the second electrical bus is converted to a second DC signal by the second AC-DC converter 48. The DC signal provided by the first AC-DC converter 40 powers the controller 56, which in turn generates a periodic switching signal that controls the switching frequency and/or duty cycle of the DC-DC converter 64. The second DC signal received by the DC-DC converter 64 on the fourth electrical bus 66 is regulated to a fixed voltage that is appropriate for application to the energy storage unit 78 and is received by the energy storage unit 78 over the sixth electrical bus 80. Energy is released on demand by a load (not shown) that couples to the seventh electrical bus 86.

Those skilled in the art will recognize improvements and modifications to the embodiments of the present disclosure. All such improvements and modifications are considered within the scope of the concepts disclosed herein and the claims that follow.

What is claimed is:

1. A vibrational energy harvesting system comprising:
   a first energy harvesting unit configured to convert mechanical vibrations into a first AC signal;
   a second energy harvesting unit configured to convert mechanical vibrations into a second AC signal;
   a first AC-DC converter coupled to the first energy harvesting unit and configured to convert the first AC signal into a first DC signal;
   a second AC-DC converter coupled to the second energy harvesting unit and configured to convert the second AC signal into a second DC signal;
   a controller coupled to the first AC-DC converter and configured to receive the first DC signal as input power and output a periodic signal; and
   a DC-DC converter coupled between the second AC-DC converter and the controller and configured to receive the second DC signal and output a regulated DC signal using energy from the second DC signal in response to the periodic signal generated by the controller.

2. The vibrational energy harvesting system of claim 1 wherein the first energy harvesting unit and the second energy harvesting unit comprise a multilayer piezoelectric cantilever having at least one end fixed to a support.

3. The vibrational energy harvesting system of claim 2 further including a first interface layer sandwiched between the first energy harvesting unit and the second energy harvesting unit to provide electrical isolation between the first energy harvesting unit and the second energy harvesting unit.

4. The vibrational energy harvesting system of claim 1 wherein the first energy harvesting unit and the second energy harvesting unit each comprise a top electrode, a bottom electrode, and a piezoelectric multilayer sandwiched between the top electrode and the bottom electrode.

5. The vibrational energy harvesting system of claim 4 wherein the piezoelectric multilayer comprises a plurality of alternating layers of piezoelectric material and electrodes.

6. The vibrational energy harvesting system of claim 1 wherein the DC-DC converter is configured to boost voltage of the second DC signal and thereby generate the regulated DC signal as an average voltage of the second DC signal falls below a predetermined voltage level.

7. The vibrational energy harvesting system of claim 1 wherein the DC-DC converter is configured to buck voltage of the second DC signal and thereby generate the regulated DC signal as an average voltage of the second DC signal rises above a predetermined voltage level.

8. The vibrational energy harvesting system of claim 1 wherein the DC-DC converter is configured to boost voltage of the second DC signal and thereby generate the regulated DC signal as an average voltage of the second DC signal falls below a first predetermined voltage level and buck voltage of the second DC signal and thereby generate the regulated DC signal as an average voltage of the second DC signal rises above a second predetermined voltage level.

9. The vibrational energy harvesting system of claim 8 wherein the first predetermined voltage level and the second predetermined voltage level are the same.

10. The vibrational energy harvesting system of claim 1 wherein the DC-DC converter is configured to provide a continuous flow of energy to an energy storage unit.

11. A method of vibrational energy harvesting comprising:
   providing a vibrational energy harvesting system having a first energy harvesting unit, a second energy harvesting unit, a first AC-DC converter, a second AC-DC converter, a controller and a DC-DC converter;

converting mechanical vibrations into a first AC signal via the first energy harvesting unit;

converting mechanical vibrations into a second AC signal via the second energy harvesting unit; converting the first AC signal to a first DC signal via the first AC-DC converter;

converting the second AC signal to a second DC signal via the second AC-DC converter;

powering the controller with the first DC signal to output a periodic signal from the controller to control switching of the DC-DC converter; and powering the DC-DC converter with the second DC signal to output a regulated DC signal from the DC-DC converter.

12. The method of vibrational energy harvesting of claim 11 further comprising storing energy of the regulated DC signal output from the DC-DC converter into an energy storage unit.

13. The method of vibrational energy harvesting of claim 11 wherein the first energy harvesting unit and the second energy harvesting unit comprise a multilayer piezoelectric cantilever.

14. The method of vibrational energy harvesting of claim 11 wherein the first energy harvesting unit and the second energy harvesting unit each comprise a top electrode, a bottom electrode, and a piezoelectric multilayer sandwiched between the top electrode and the bottom electrode.

15. The method of vibrational energy harvesting of claim 14 wherein the piezoelectric multilayer comprises a plurality of alternating layers of piezoelectric materials and electrodes.

16. The method of vibrational energy harvesting of claim 11 further comprising boosting voltage of the second DC signal to generate the regulated DC signal as an average voltage of the second DC signal falls below a predetermined voltage level.

17. The method of vibrational energy harvesting of claim 11 further comprising bucking voltage of the second DC signal to generate the regulated DC signal as an average voltage of the second DC signal rises above a predetermined level.

18. The method of vibrational energy harvesting of claim 11 further comprising boosting voltage of the second DC signal to generate the regulated DC signal as an average voltage of the second DC signal falls below a first predetermined voltage level and bucking voltage of the second DC signal to generate the regulated DC signal as an average voltage of the second DC signal rises above a second predetermined level.

19. The method of vibrational energy harvesting of claim 18 wherein the first predetermined level and the second predetermined level are the same.

20. The method of vibrational energy harvesting of claim 11 wherein the DC-DC converter is configured to provide a continuous flow of energy to a load.

* * * * *